United States Patent [19]

Meyer

[11] Patent Number: 5,212,445

[45] Date of Patent: May 18, 1993

[54] METHOD AND APPARATUS FOR DETECTION AND IDENTIFICATION OF FLAWS IN A MAGNETIC MEDIUM BY MEASURING THE WIDTH OF PULSES STORED ON THE MEDIUM

[75] Inventor: Forrest C. Meyer, Eden Prairie, Minn.

[73] Assignee: Seagate Technology, Inc., Scotts Valley, Calif.

[21] Appl. No.: 654,936

[22] Filed: Feb. 13, 1991

[51] Int. Cl.$^5$ .................... G01R 33/12; G04F 11/12; G11B 5/09; G11B 15/14

[52] U.S. Cl. .................... 324/212; 328/129.1; 360/51

[58] Field of Search .................... 324/210–212; 328/109, 120, 140, 129.1; 307/234; 360/31, 51, 53; 369/53, 59

[56] References Cited

U.S. PATENT DOCUMENTS

| | | | |
|---|---|---|---|
| 3,835,383 | 9/1974 | Crofford | 328/129.1 |
| 3,997,876 | 12/1976 | Frush | 340/172.5 |
| 4,281,356 | 7/1981 | Sousa | 360/45 |
| 4,578,721 | 3/1986 | Brannan, Jr. | 360/51 |
| 4,714,968 | 12/1987 | Troletti | 360/51 |
| 4,772,843 | 9/1988 | Asaka et al. | 328/129.1 |
| 4,908,722 | 3/1990 | Sonobe | 360/46 |
| 4,914,530 | 4/1990 | Graham et al. | 360/48 |

*Primary Examiner*—Walter E. Snow
*Attorney, Agent, or Firm*—Kinney & Lange

[57] ABSTRACT

A flaw identification circuit receives digitized read data and provides an error output representative of defects in a magnetic storage medium. A uniform data pattern is written on the magnetic storage medium. The flaw identification circuitry uses a precision delay circuit and a linear ramp circuit. The linear ramp circuit generates a linear ramp using the charging of a capacitor with a constant current source. This provides an accurate time base reference. The output of the linear ramp circuit is applied to a flash analog-to-digital converter. The flash analog-to-digital converter is directly triggered by the digitized read data signal. The output of the flash analog-to-digital converter is applied to a maximum comparator and a minimum comparator. If the output value of the analog-to-digital converter falls outside of the maximum and minimum value range, an error is signalled. The error is representative of shifts in the location of edges of data pulses in the digitized read data signal. This corresponds to a defect in the magnetic storage medium.

10 Claims, 4 Drawing Sheets

METHOD AND APPARATUS FOR DETECTION AND IDENTIFICATION OF FLAWS IN A MAGNETIC MEDIUM BY MEASURING THE WIDTH OF PULSES STORED ON THE MEDIUM

BACKGROUND OF THE INVENTION

The present invention relates to identifying flaws in a magnetic storage system. In particular, the present invention relates to identifying flaws by monitoring the location of window edges in a readback signal of a magnetic storage system.

In a magnetic storage system, such as a computer disc drive, digital information is magnetically i0 stored upon the surface of a magnetic disc. The digital information is represented by seleotivelY polarizing the magnetic field of consecutive areas across the surface of the rotating magnetic disc. When this information is read back from the storage disc, the magnetic polarization of the medium is sensed and converted into an electrical output signal. This reading and writing operation is through a magnetic read/write head which is suspended over the surface of the rotating disc and which provides a raw data signal. The raw data signal is representative of relative strength of the magnetic flux density present on the magnetic disc. It is highly desirable to provide the highest level of information storage density possible for a given magnetic storage system. Unfortunately, increased storage density leads to significant noise levels in the raw data signal.

The raw data signal comprises a series of data "peaks" whose location is used to represent digital information. With high data storage densities, the precise location of a data peak becomes critical because adjacent data peaks are spaced very close together. If a data peak is shifted slightly in time, incorrect information may be read back. This causes a bit shift error in the digital data signal.

Flaws in the magnetic storage medium may induce shifts in the edges of the data peaks. Severe shifts may result in errors during readback of magnetically encoded information. When manufacturing a disc drive system, it is critical that the manufacturer be able to measure bit shift for a given head/disc combination at the desired storage density. This measurement is used to certify the storage system, guaranteeing a maximum error rate at the specified data storage density. Furthermore, if a magnetic storage medium has a small number of localized flaws, it is possible to map out the defective areas on the surface of the storage medium. Typically, a map is generated during manufacture of the storage system. The map is stored in a disc controller. During operation, the map is used to identify flawed sectors in the disc surface. The flawed disc sectors are not used for information storage.

A simple and accurate method and apparatus for locating flaws in the surface of magnetic storage media would be a significant contribution to the art.

SUMMARY OF THE INVENTION

The present invention provides a method and apparatus for locating flaws in the surface of a magnetic storage medium. The flaws are detected by measuring the location of edges in a data readback window generated from the magnetic storage medium.

A uniform data pattern is written upon the surface of the magnetic storage medium under test. When this pattern is read back, spaces between edges of successive data windows for the uniform pattern of data should also be uniform. Flaws in the surface of the storage medium will alter the location of the data window. Detection of this data window movement provides a means of detecting medium flaws. If a window edge falls outside of predetermined limits, an error is signalled which indicates a flawed portion of the magnetic storage medium.

The present invention receives digitized read data from readback circuitry coupled to the read head of a magnetic storage system. The digitized read data is applied to a precision delay generator. The precision delay generator produces a rectangular waveform whose leading edge is delayed by a fixed amount from pulses in the digitized read data. The trailing edge in the rectangular waveform generated by the precision delay generator corresponds to the leading edge of the next data pulse in the digitized read data signal. The output from the precision delay generator is applied to a linear ramp generator. The output of the precision delay generator provides a ramp enable signal to the linear ramp generator. The output of the linear ramp generator is triggered by the signal from the precision delay generator. The edge of a pulse in the output of the precision delay generator initiates a ramping in the output of the linear ramp generator. The output of the linear ramp generator is applied to a flash analog-to-digital converter. The flash converter receives two signals, the digitized read data and the ramp output of the linear ramp generator. The digitized read data is used by the flash converter as a trigger to trigger a conversion of the output of the linear ramp generator into a digital signal. A digital comparator compares the output of the flash converter with predetermined maximum and minimum limits. If the flash converter output is outside of the predetermined limits, an error is signalled. The error indicates a flaw in the magnetic storage medium.

The linear ramp generator uses a capacitor and a constant current source. The constant current source causes the capacitor to charge at a constant rate. Therefore, the voltage across the capacitor is directly related to time and provides an accurate time base reference.

If the storage medium exhibits a relatively small number of flaws in its surface, the location of the flaws may be stored in a disc controller and map out of use during operation. However, if a relatively large number of flaws are detected in the surface of the magnetic storage medium, a manufacturer can choose to discard the entire medium as defective.

The charging of a capacitor with a constant current source and triggering of an analog-to-digital converter in accordance with the present invention is useful in any situation in which a high speed time base reference which is triggered by a first and a second signal is required.

DETAILED DESCRIPTION OF THE PREFERRED EMBODIMENTS

The present invention provides a method and apparatus for measuring spacing between edges of data windows in a readback signal from a magnetic disc storage system. Flaws in the magnetic storage medium shift the position of data windows relative to other data windows. Detection of data window shifts provides a means of detecting flaws in the storage medium. Flaws can be detected and used to produce a map of the flaws in the surface of the storage medium. This map can be used by a disc controller so that flawed portions of the magnetic storage medium are not used for storing information.

Figure 1:
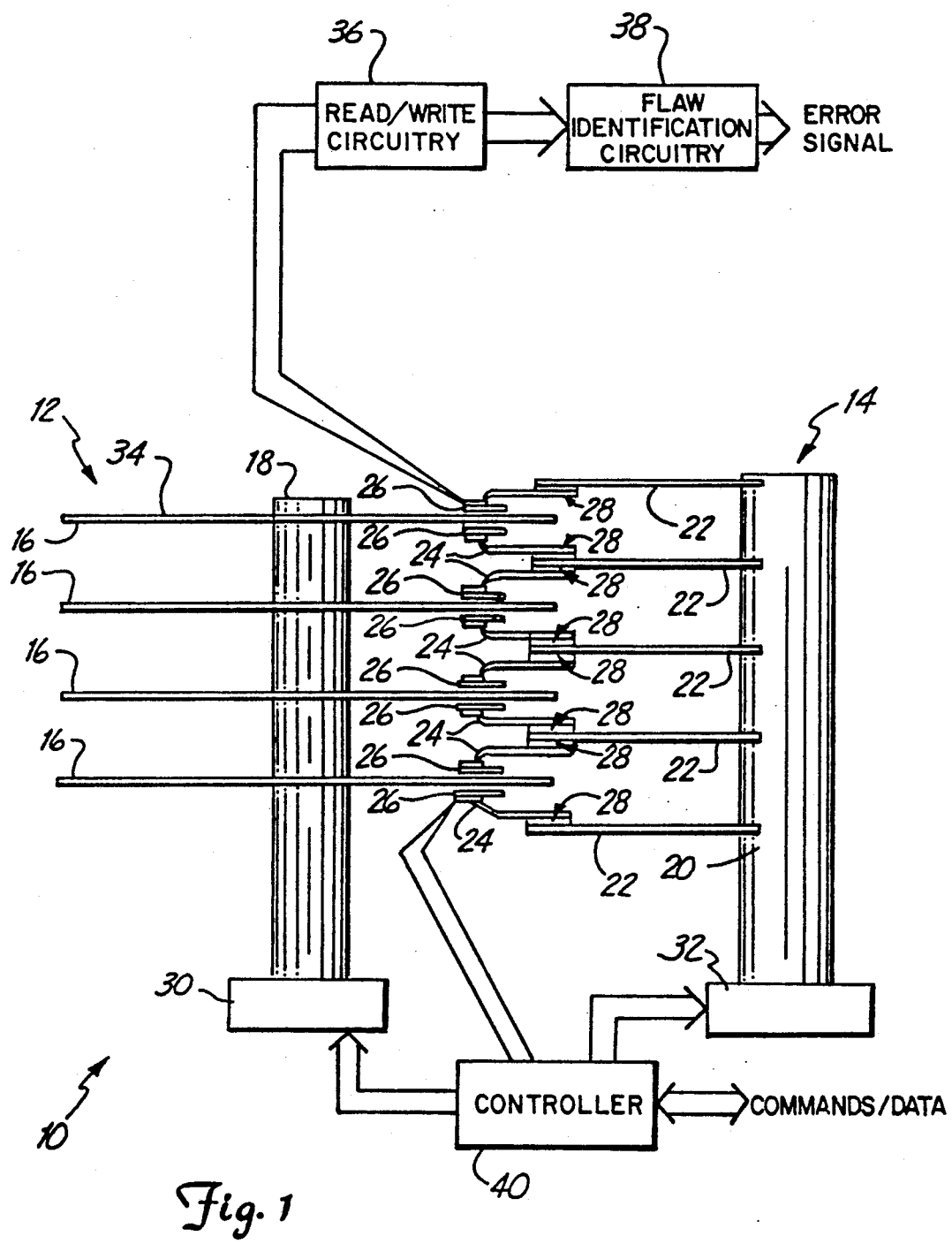
FIG. 1 shows a magnetic disc storage system which includes flaw identification circuitry in accordance with the present invention.

A disc drive assembly 10 is shown in FIG. 1. Disc drive assembly 10 comprises a disc pack 12 and an E-block assembly 14. Disc pack 12 comprises discs 16 stacked on a drive spindle 18. E-block assembly 14 comprises a servo-spindle 20 and a plurality of support arms 22. Each support arm carries one or two flexure arms 24. Each flexure arm 24 carries a magnetic head assembly 26. Each flexure arm 24 mounts to its corresponding support arm 22 by a mount 28. A spindle motor 30 is coupled to drive spindle 18. An actuator 32 is coupled to servo-spindle 20.

Read/write circuitry 36 is connected to a magnetic head 26. Read/write circuitry 36 provides a digitized read data signal to flaw identification circuitry 38. Flaw identification circuitry 38 provides an error signal output in accordance with the present invention. A controller 40 receives commands (for example, "SEEK" or "WRITE") and controls operation of disc drive 10. Controller 40 is connected to spindle motor 30 and actuator 32. Controller 40 is also connected to a magnetic head 26.

In operation, motor 30 rotates drive spindle 18 which causes discs 16 to rotate in unison. Actuator 32 moves servo-spindle 20 so that magnetic heads 26 move between data tracks on disc 16. Readback circuitry 36 converts a raw data signal from a magnetic head 26 into digitized read data. The output of readback circuitry 36 is applied to flaw identification circuitry 38. Controller 40 receives commands and data from a data bus. Based upon received commands, controller 40 controls operation of spindle motor 30 and actuator 32. Controller 40 may include a map of surfaces of discs 16. Controller 40 uses the map to identify flaws in the surfaces of magnetic discs 16. Flawed areas of discs 16 are not used to store information.

In accordance with the present invention, flaw identification circuitry 38 receives data signals generated from the surfaces of magnetic storage discs 16. Typically, flaw identification is performed on all the disc surfaces in disc pack 12. However, for this example only surface 34 is tested. A uniform data signal is written on surface 34 of a disc 16 by read/write circuitry 36. The error signal generated from flaw identification circuitry 38 is indicative of a flaw in a surface 34 of a magnetic storage disc 16.

Figure 2:
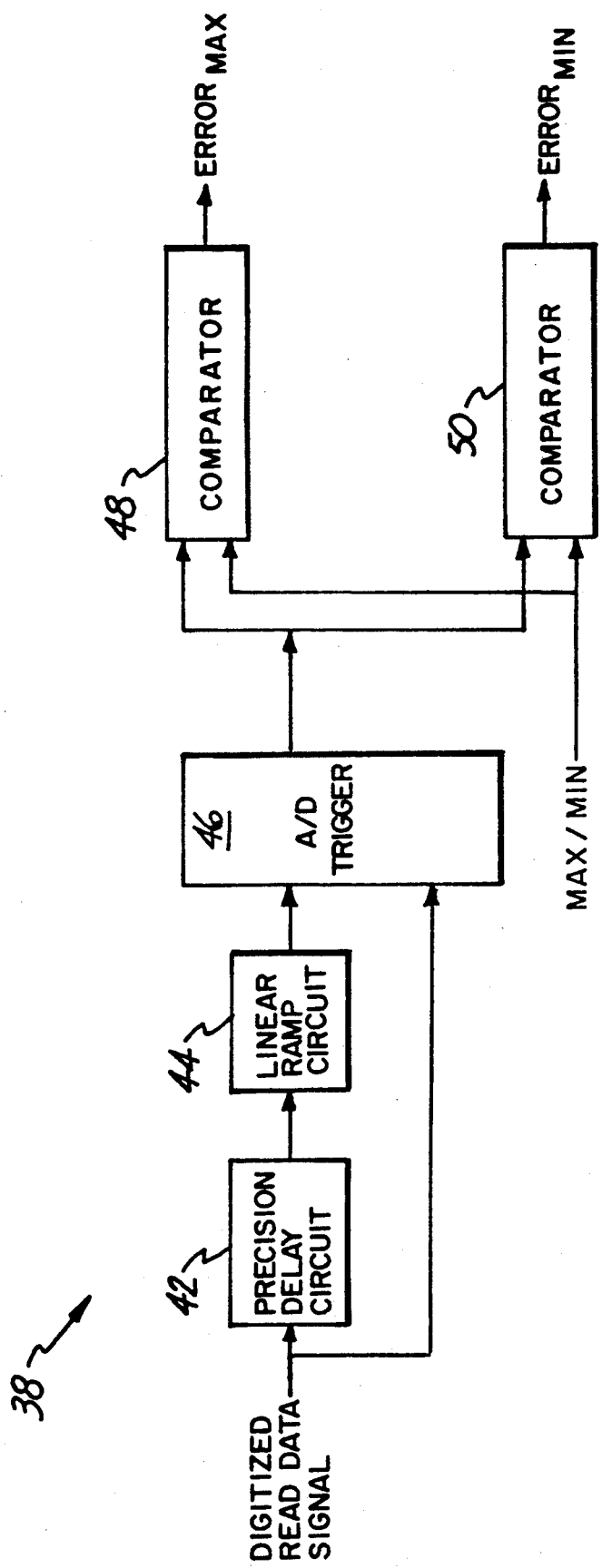
FIG. 2 shows a block diagram of a circuit for locating flaws in a magnetic storage medium in accordance with the present invention.

FIG. 2 is a block diagram of flaw identification circuitry 38 made in accordance with the present invention. In FIG. 2, a digitized read data signal from read/write circuitry 36 is applied to a precision delay circuit 42. The output of precision delay circuit 42 is received by a linear ramp circuit 44. The output of linear ramp circuit 44 is connected to a flash analog-to-digital converter 46. Flash analog-to-digital converter 46 includes a trigger. The trigger of flash analog-to-digital converter 46 is connected to read/write circuitry 36 and receives the digitized read data signal. Linear ramp circuitry 44 is connected to the data input of flash analog-to-digital converter 46. The output of flash analog-to-digital converter 46 is received by maximum comparator 48 and minimum comparator 50. Comparators 48 and 50 also receive a max/min input period. The maximum/minimum input sets the value at which maximum comparator 48 will provide an Error$_{maximum}$ output in response to the input from the flash analog-to-digital converter 46. Similarly, the maximum/minimum input sets the value at which minimum comparator 50 provides an Error$_{minimum}$ signal output in response to an input from the flash analog-to-digital converter 46.

Figure 3:
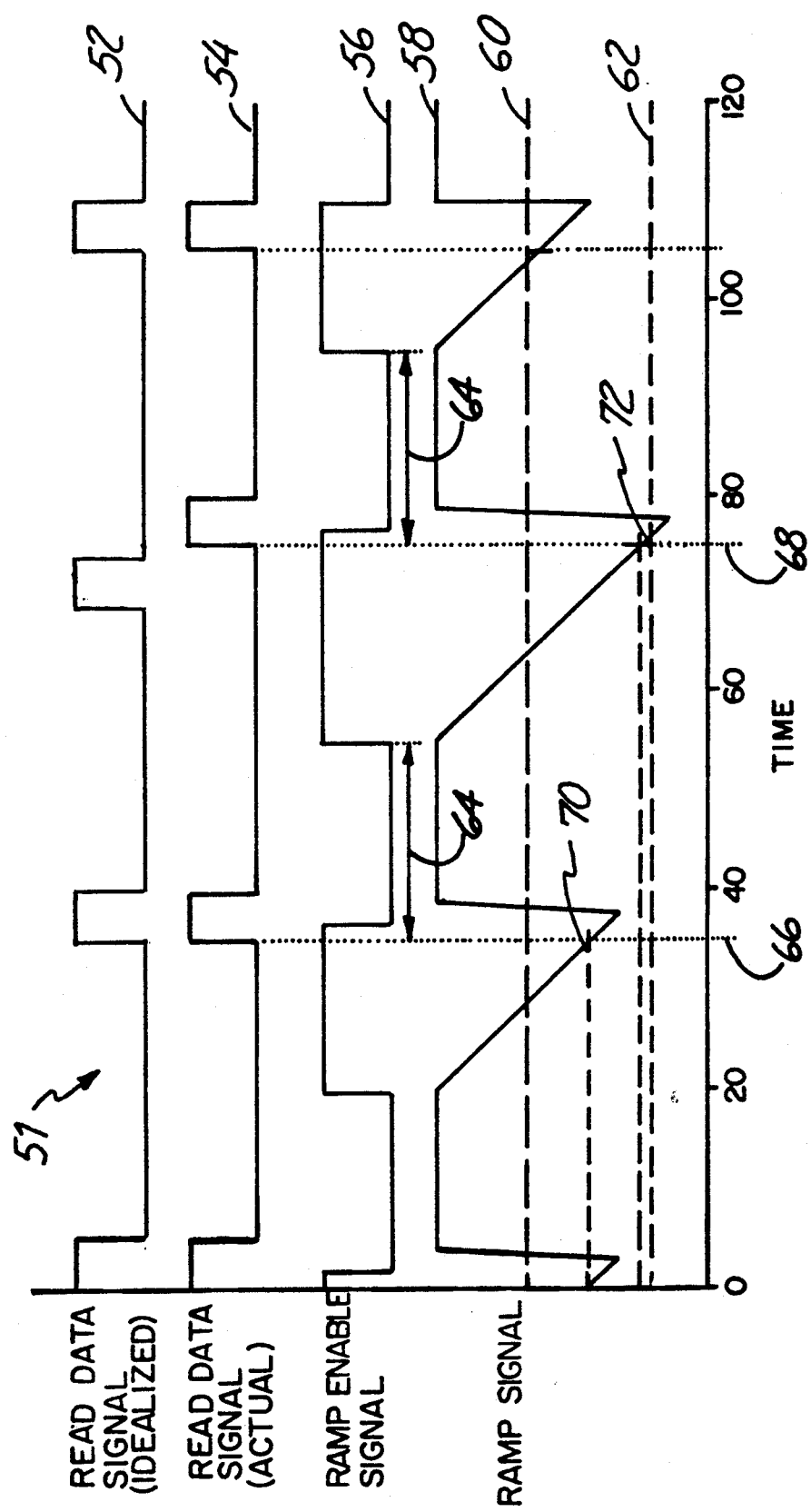
FIG. 3 is a timing diagram of the circuit of FIG. 2.

FIG. 3 is a timing diagram of data signals in flaw identification circuitry 38 of FIG. 2. FIG. 3 is a graph of signal levels versus time. In FIG. 3, an idealized digitized read data signal 52 is shown as a reference. An actual digitized read data signal 54 is shown relative to idealized digitized read data signal 52. Digitized read data signal 54 is applied to precision delay circuit 42 and to the trigger of analog-to-digital conversion circuit 46. A ramp enable waveform 56 comprises the output signal from precision delay circuit 42. Ramp enable waveform 56 is applied to the input of linear ramp circuit 44. A linear ramp waveform 58 shown in FIG. 3 comprises the output of linear ramp circuit 44. Linear ramp signal 58 is applied to the input of flash analog-to-digital converter 46. A minimum level 60 and a maximum level 62 shown in FIG. 3 relative to linear ramp signal 58 are established by the maximum/minimum input to maximum comparator 48 and minimum comparator 50.

In operation, a uniform data signal is written on surface 34 of a disc 16 by read/write circuitry 36. During testing, read/write circuitry 36 receives a weak read signal from magnetic transducer 26. This is amplified and converted into digitized read data by amplifying and hard limiting the raw data readback signal. The hard limited signal is applied to pulse forming circuitry that produces pulse representations of information stored on a surface 34 of magnetic storage disc 16. Each digital pulse in the output from read/write circuitry 36 represents a bit of digitized information. A bit of information on surface 34 of magnetic storage disc 16 is represented by a change in the magnetic flux of surface 34. For example, if a constant frequency signal is recorded on surface 34 of disc 16, and if surface 34 of disc 16 contains no distortions, the output of read/write circuitry 36 would comprise a series of evenly spaced data pulses of equal duration.

The output of read/write circuitry 36 comprises a digitized read data signal which is applied to flaw identification circuitry 38. The digitized read data signal provided from read/write circuitry 36 is received by precision delay circuit 42 and flash analog-to-digital converter 46. Timing diagram 51 of FIG. 3 shows a representative waveform of digitized read data signal 54. Timing diagram 51 also shows a waveform of an idealized digitized read data signal 52. Idealized digitized read data signal 52 is representative of readback pulses generated by read/write circuitry 36 if surface 34 of magnetic storage disc 16 is flawless. However, flaws in surface 34 of magnetic storage disC 16 introduce position and time shifts in data pulses in digitized read data signal 54. These shifts are evident when pulses in digitized read data signal 54 are compared with idealized read data signal 52.

The digitized read data signal from read/write circuit 36 represented by waveform 54 and timing diagram 51 is applied to the input of precision delay circuit 42. Precision delay circuit 42 produces a rectangular waveform. Each pulse in the rectangular waveform generated by precision delay circuit 42 corresponds to digitized read data from read/write circuitry 36. The output of precision delay circuit 42 is shown by the ramp enable waveform 56 of timing diagram 51 shown in FIG. 3. Leading edges in ramp enable signal 56 correspond to leading edges in pulses in the digitized read data signal 54 after a delay 64. The trailing edges of data pulses in ramp enable signal 56 correspond to the leading edge of the next data pulse in digitized read data signal 54.

Precision delay circuit 42 is used to delay the stream of data pulses in the digitized read data signal 54. This allows the digitized read data signal 54 to directly trigger flash analog-to-digital converter 46. Delay 64 also delays the start of the ramping portion of linear ramp signal 58 until the preceding ramp has completely settled. Delay 64 generated by precision delay circuit 42 should provide a repeatable delay for each of the data pulses in digitized read data signal 54.

The output waveform from precision delay circuit 42 (ramp enable signal 56) is applied to the input of linear ramp circuit 44. Ramp enable signal 56 results in linear ramp signal 58 shown in timing diagram 51 of FIG. 3. The leading edges of data pulses in ramp enable signal 56 cause linear ramp signal 58 to start discharging at a controlled rate. This rate is selected so that the maximum expected time between digitized read data pulses in digitized read data signal 54 cause the signal level of linear ramp 38 to remain within the conversion range of analog-to-digital flash converter 46. For example, a constant frequency input to linear ramp circuit 44 will cause the ramp signal output to reach the same value on each cycle. As the input frequency changes, and the time between data pulses on the input signal to linear ramp circuit 44 changes, the swing in the output voltage of linear ramp signal 58 will change. Linear ramp circuit 44 is discussed in more detail in the discussion of FIG. 4.

Linear ramp signal 58 from the output of linear ramp circuit 44 is applied to the converting input of flash analog-to-digital converter 46. The trigger input of flash analog-to-digital converter 46 is connected to read/write circuitry 36 and receives digitized read data signal 54 as a trigger signal. The leading edge of data pulses in digitized read data signal 54 triggers flash analog-to-digital converter 46 to convert the voltage input from linear ramp circuit 44 into a digital value. The output of flash analog-to-digital converter 46 is a digital, binary-weighted, signal which represents a linear voltage at its input.

Flash analog-to-digital converter 46 is triggered at the trigger time indicated at time 66 and time 68 shown in FIG. 3. The edge of digital read signal 54 which occurs at time 66 causes analog-to-digital converter 46 to convert linear ramp 58 at the voltage level indicated at level 70 in FIG. 3. The edge of digital read signal 54 which occurs at time 68 causes analog-to-digital converter 46 to convert the level of ramp 58 at the voltage level shown at level 72 in FIG. 3. In both cases, the output of analog-to-digital converter 46 is a binary representation of the value of linear ramp 58 at the time of conversion. The output of flash analog-to-digital converter 46 is applied to inputs of maximum comparator 48 and minimum comparator 50.

Maximum comparator 48 and minimum comparator 50 receive inputs from flash analog-to-digital converter 46 and a maximum/minimum set input. Maximum comparator 48 provides an Error$_{maximum}$ output. Minimum comparator 50 provides an Error$_{minimum}$ output. Maximum/minimum set is used to determine the maximum valid level 62 of linear ramp 58 and the minimum valid level 60 of linear ramp 58. Timing diagram 51 shown in FIG. 3 shows the relationship between minimum valid level 60, maximum valid level 62 and linear ramp signal 58. If linear ramp signal 58 falls outside of levels 60 and 62 at the time flash analog-to-digital converter 46 is triggered by pulses in the read data signal 54, the appropriate Error$_{maximum}$ or Error$_{minimum}$ signal is output from the maximum comparator 48 and minimum comparator 50. This indicates the occurrence of an unacceptably high level of distortion in the readback signal. Error signals from maximum comparator 48 and minimum comparator 50 can be correlated with the location of readback head 26 relative to surface 34 of magnetic storage disc 16. The location of defective portions of surface 34 of magnetic storage disc 16 can be stored in controller 40 so that flawed portions are not used by controller 40 to stor ⓔinformation.

Figure 4:
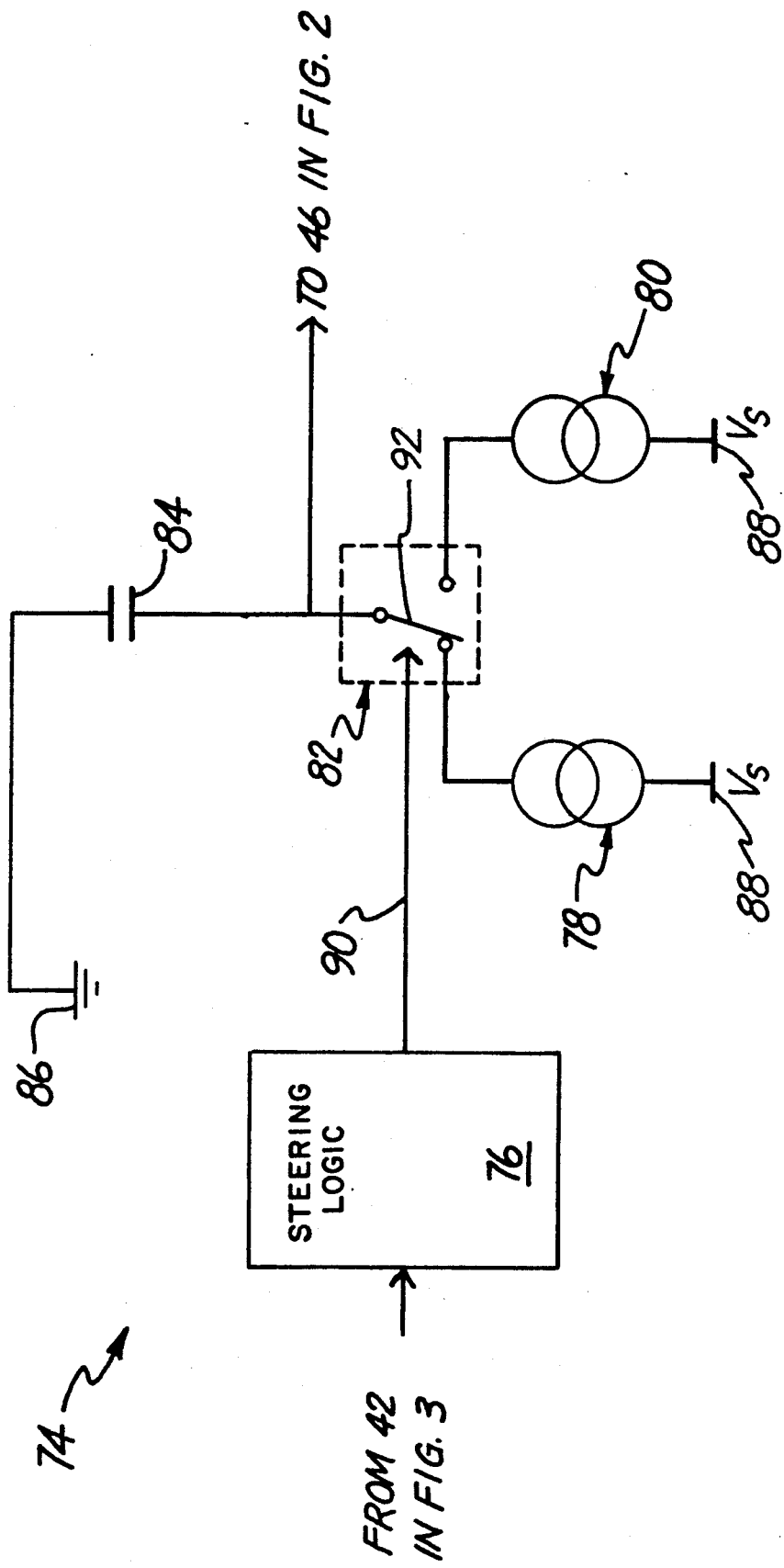
FIG. 4 is an electrical circuit diagram of a linear ramp generator shown in FIG. 2.

FIG. 4 is a simplified electrical schematic diagram 74 of linear ramp circuit 44. Schematic diagram 74 includes steering logic 76, current sources 78 and 80, switch circuit 82, capacitor 84, electrical ground 86 and a power supply 88. Steering logic 76 receives an input from precision delay circuit 42 shown in FIG. 3. Steering logic 76 provides a switch control output 90 which is connected to switch circuitry 82. Switch circuitry 82 is connected to constant current sources 78 and 80. Each constant current source 78 and 80 is also connected to a power supply source 88. Switch circuitry 82 connects to one terminal of capacitor 84. The other terminal of capacitor 84 connects to electrical ground 86. The output from linear ramp circuit 44 shown in FIG. 2 is taken between capacitor 84 and switch circuitry 82. Switch circuitry 82 includes a switch 92 which is controlled by steering logic circuit 76 over switch control line 90. Switch 92 is a two-position switch which switches capacitor 84 between constant current source 78 and constant current source 80.

Steering logic 76 controls switch 72 based upon ramp enable signal 56 received from precision delay circuit 42. Steering logic 76 initiates charging and discharging of capacitor 84. Constant current sources 78 and 80 have current ratios of approximately 10:1. Furthermore, constant current sources 78 and 80 have opposite signs and therefore provide charging current to capacitor 84 in opposite directions. Current source 78 charges capacitor 84 and current source 80 discharges capacitor 84. When capacitor 84 is discharged, linear ramp signal 58 reaches a limiting state. This is shown as a plateau in linear ramp signal 58 shown in FIG. 3. This is the system's rest or stable state. A leading edge of a pulse in ramp enable signal 56 causes current steering logic circuit 76 to switch the position of switch 92. Constant current source 80 begins discharging capacitor 84 at a controlled rate. The rate of discharge of capacitor 84 is selected so that the maximum expected time between digitized read pulses in the digitized read data signal will cause the ramping portion of linear ramp signal 58 to remain within the conversion range of analog-to-digital flash converter 46. The rate of discharge of capacitor 84 is nearly constant due to the design of constant current source. This provides an accurate and relatively inexpensive time base reference for determining shifts in the edges of successive windows in the digitized read data signal. Constant current sources 78 and 80 should be of appropriate design for the desired measurement accuracy of the flaw identification circuitry.

The present invention provides an inexpensive and accurate method and apparatus for detecting variations in the spacing between edges of digital data pulses in a readback signal from a magnetic storage medium. The spacing variations are used as indications of flaws in the surface of the storage medium. The invention uses a precision delay circuit to delay the digitized read data signal. The delayed signal is applied to a linear ramp circuit. The linear ramp circuit triggers the charging of a capacitor. The charging is through a constant current source. This generates a linear ramp which is applied to a flash analog-to-digital converter. The conversion by the analog-to-digital converter is directly triggered by pulses in the digitized read data signal. The digitized output of the analog-to-digital converter is applied to a maximum comparator and a minimum comparator. The comparators indicate if the value of the linear ramp at the time of the analog-to-digital conversion has exceeded predetermined maximum and minimum limits. The occurrence of an error indicates that the spacing between adjacent data windows in the digitized read data signal has varied beyond an acceptable amount. Such an error correlates to a flaw in the surface of the magnetic storage medium. The location of the flaw can be mapped so that the flawed portion of the magnetic disc is not used to record information.

Although the present invention has been described with reference to preferred embodiments, workers skilled in the art will recognize that changes may be made in form and detail without departing from the spirit and scope of the invention.

What is claimed is:

1. An apparatus for measuring spacing between edges of successive data pulses in a magnetic storage system which includes a magnetic storage surface and a magnetic head for reading information from the magnetic storage surface of the magnetic storage system, the apparatus comprising:

a capacitor;

first means coupled to the capacitor for charging the capacitor;

means connected to the capacitor for initiating charging of the capacitor by the means for charging the capacitor in response to detecting an edge of a first data pulse from the magnetic head;

an analog-to-digital converter connected to the capacitor for converting a voltage level measured across the capacitor to a digital value in response to an edge of a second data pulse from the magnetic head, whereby the digital value is representative of a time period between the edge of the first data pulse and the edge of the second data pulse; and comparator means connected to the analog-to-digital converter for comparing the digital value to predetermined limits and producing an error signal if the digital value falls outside the pedetermined limits.

2. The apparatus of claim 1 wherein the means for charging the capacitor comprises a constant current source whereby the capacitor provides a linear ramping signal level.

3. The apparatus of claim 1 including second means for charging the capacitor in a direction opposite to the first means for charging the capacitor.

4. The apparatus of claim 1 wherein the means for initiating charging of the capacitor comprises steering logic for receiving data pulses and a switch connected between the capacitor and the means for charging the capacitor.

5. The apparatus of claim 1 including a precision delay circuitry coupled between the magnetic head and the steering logic for delaying edges of data pulses from the magnetic head.

6. The apparatus of claim 1 and further including means for storing a map of flawed portions of the magnetic storage system.

7. A method of measuring spacing between edges of successive data pulses in a magnetic storage system, comprising:

reading a data signal from a magnetic storage surface;

charging a capacitor in response to an edge in a first data pulse in the data signal;

converting an analog signal level on the capacitor into a digital signal level in response to an edge in a subsequent data pulse in the data signal whereby the digital signal is representative of the time period between the edge of the first data pulse and the edge of the subsequent data pulse; and comparing the digital signal to predetermined limits and producing an error signal if the digital signal falls outside the predetermined limits, wherein the error signal is indicative of a flawed portion of the magnetic storage surface.

8. The method of claim 7 and further including mapping flawed portions of the magnetic storage surface.

9. The method of claim 7 including charging the capacitor in an opposite direction between successive steps of charging the capacitor.

10. The method of claim 7 wherein charging the capacitor comprises charging the capacitor with a constant current source.

* * * * *